(12) United States Patent
Honma

(10) Patent No.: US 12,247,287 B2
(45) Date of Patent: Mar. 11, 2025

(54) APPARATUS FOR PERFORMING FILM FORMING PROCESS ON SUBSTRATE AND METHOD OF USING VACUUM CHUCK MECHANISM PROVIDED IN THE APPARATUS

(71) Applicant: Tokyo Electron Limited, Tokyo (JP)

(72) Inventor: Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 477 days.

(21) Appl. No.: 17/804,128

(22) Filed: May 26, 2022

(65) Prior Publication Data

US 2022/0389582 A1 Dec. 8, 2022

(30) Foreign Application Priority Data

Jun. 3, 2021 (JP) ................................. 2021-093838

(51) Int. Cl.
*C23C 16/455* (2006.01)
*C23C 16/34* (2006.01)
(Continued)

(52) U.S. Cl.
CPC ...... *C23C 16/45551* (2013.01); *C23C 16/345* (2013.01); *C23C 16/4412* (2013.01);
(Continued)

(58) Field of Classification Search
CPC ............ C23C 16/45551; C23C 16/345; C23C 16/4412; C23C 16/45512;
(Continued)

(56) References Cited

U.S. PATENT DOCUMENTS 6,716,329 B2 * 4/2004 Okase .................. C25D 17/001
134/84
2002/0094260 A1 * 7/2002 Coomer .............. H01L 21/6838
414/416.09

(Continued)

FOREIGN PATENT DOCUMENTS

| CN | 116072573 A | * | 5/2023 | |
|---|---|---|---|---|
| EP | 4447099 A1 | * | 10/2024 | |
| JP | 2013-168437 A | | 8/2013 | |
| JP | 2018-056300 A | | 4/2018 | |
| WO | WO-2010024678 A1 | * | 3/2010 | ....... H01L 21/67132 |

*Primary Examiner* — Jeffrie R Lund
(74) *Attorney, Agent, or Firm* — Armstrong Teasdale LLP

(57) ABSTRACT

An apparatus that performs a film forming process includes: a rotary table having one surface on which substrates are placed and for revolving the substrates around a rotary shaft; a vacuum container configured to accommodate the rotary table and configured such that a space formed between the vacuum container and the one surface is separated into a first processing region and a second processing region, and the substrates repeatedly and alternately pass through the first and second processing regions; a vacuum chuck mechanism provided in the rotary table and including suction ports opened to placement regions on which the substrates are placed, to suction and fix the substrates, and suction flow paths provided to communicate with the suction ports; and a switching mechanism configured to switch an operation status of the vacuum chuck mechanism between a full fixed state and a selective release state.

15 Claims, 8 Drawing Sheets

(51) Int. Cl.
  *C23C 16/44* (2006.01)
  *C23C 16/458* (2006.01)
  *C23C 16/46* (2006.01)
  *H01L 21/683* (2006.01)
  *H01L 21/687* (2006.01)

(52) U.S. Cl.
  CPC .. *C23C 16/45512* (2013.01); *C23C 16/45536* (2013.01); *C23C 16/45557* (2013.01); *C23C 16/45565* (2013.01); *C23C 16/4584* (2013.01); *C23C 16/4586* (2013.01); *C23C 16/46* (2013.01); *H01L 21/6838* (2013.01); *H01L 21/68792* (2013.01); *C23C 16/45548* (2013.01); *H01L 21/68771* (2013.01)

(58) Field of Classification Search
  CPC ........ C23C 16/45536; C23C 16/45557; C23C 16/45565; C23C 16/4584; C23C 16/4586; C23C 16/46; C23C 16/45548; H01L 21/6838; H01L 21/68792; H01L 21/68771
  See application file for complete search history.

(56) References Cited

U.S. PATENT DOCUMENTS

| | | | |
|---|---|---|---|
| 2010/0132614 A1* | 6/2010 | Kato | C23C 16/45551 118/723 R |
| 2010/0227059 A1* | 9/2010 | Kato | C23C 16/45551 427/255.28 |
| 2016/0035619 A1* | 2/2016 | Yu | C23C 16/18 438/680 |
| 2017/0287770 A1* | 10/2017 | Gangakhedkar | H01L 21/68771 |
| 2022/0389582 A1* | 12/2022 | Honma | C23C 16/45512 |
| 2023/0069624 A1* | 3/2023 | Honma | C23C 16/402 |
| 2023/0193464 A1* | 6/2023 | Kuribayashi | C23C 16/45551 118/708 |
| 2023/0207375 A1* | 6/2023 | Nakashima | H01L 21/681 438/800 |
| 2023/0313378 A1* | 10/2023 | Lin | C23C 16/45544 118/728 |
| 2024/0309506 A1* | 9/2024 | Han | C23C 16/52 |

* cited by examiner

APPARATUS FOR PERFORMING FILM FORMING PROCESS ON SUBSTRATE AND METHOD OF USING VACUUM CHUCK MECHANISM PROVIDED IN THE APPARATUS

CROSS-REFERENCE TO RELATED APPLICATION

This application is based upon and claims the benefit of priority from Japanese Patent Application No. 2021-093838, filed on Jun. 3, 2021, the entire contents of which are incorporated herein by reference.

TECHNICAL FIELD

The present disclosure relates to an apparatus for performing a film forming process on a substrate and a method of using a vacuum chuck mechanism provided in the apparatus.

BACKGROUND

As a method of forming a thin film on a semiconductor wafer (hereinafter, referred to as "wafer") as a substrate, there is known an atomic layer deposition (ALD) method in which a raw material gas and a reaction gas are sequentially supplied to the surface of the wafer to laminate reaction products. As a film forming apparatus that performs a film forming process using such an ALD method, for example, Patent Document 1 discloses a configuration in which a rotary table configured to revolve a plurality of wafers arranged thereon in the circumferential direction is provided inside a vacuum container. In this configuration, the rotation of the rotary table causes the wafers to repeatedly pass through a raw material gas supply region and a reaction gas supply region alternately, thereby forming a thin film on the wafer.

PRIOR ART DOCUMENT

Patent Document

Patent Document 1: Japanese Laid-Open Patent Publication No. 2018-056300

SUMMARY

According to one embodiment of the present disclosure, there is provided an apparatus that performs a film forming process on a substrate, including: a rotary table having one surface on which a plurality of substrates are placed and configured to revolve the plurality of substrates around a rotary shaft by rotating around the rotary shaft; a vacuum container configured to accommodate the rotary table and configured such that a space formed between the vacuum container and the one surface of the rotary table is separated into a first processing region to which a first processing gas to be adsorbed on the plurality of substrates is supplied and a second processing region to which a second processing gas that reacts with the first processing gas to form a thin film on surfaces of the plurality of substrates is supplied, wherein the plurality of substrates repeatedly and alternately pass through the first processing region and the second processing region; a vacuum chuck mechanism provided in the rotary table and including a plurality of suction ports opened to placement regions on which the plurality of substrates are placed, to suction and fix the plurality of substrates, respectively, and a plurality of suction flow paths provided to communicate with the plurality of suction ports, respectively, so that interiors of the plurality of suction flow paths are evacuated; and a switching mechanism configured to switch an operation status of the vacuum chuck mechanism between a full fixed state in which the plurality of substrates are suctioned and fixed through the plurality of suction ports and a selective release state in which the evacuation of a suction flow path of the plurality of suction flow paths communicating with a selected suction port that is selected from the plurality of suction ports is stopped, so that the suctioning and fixing of the substrate through the selected suction port is released.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Apparatus>

Figure 1:
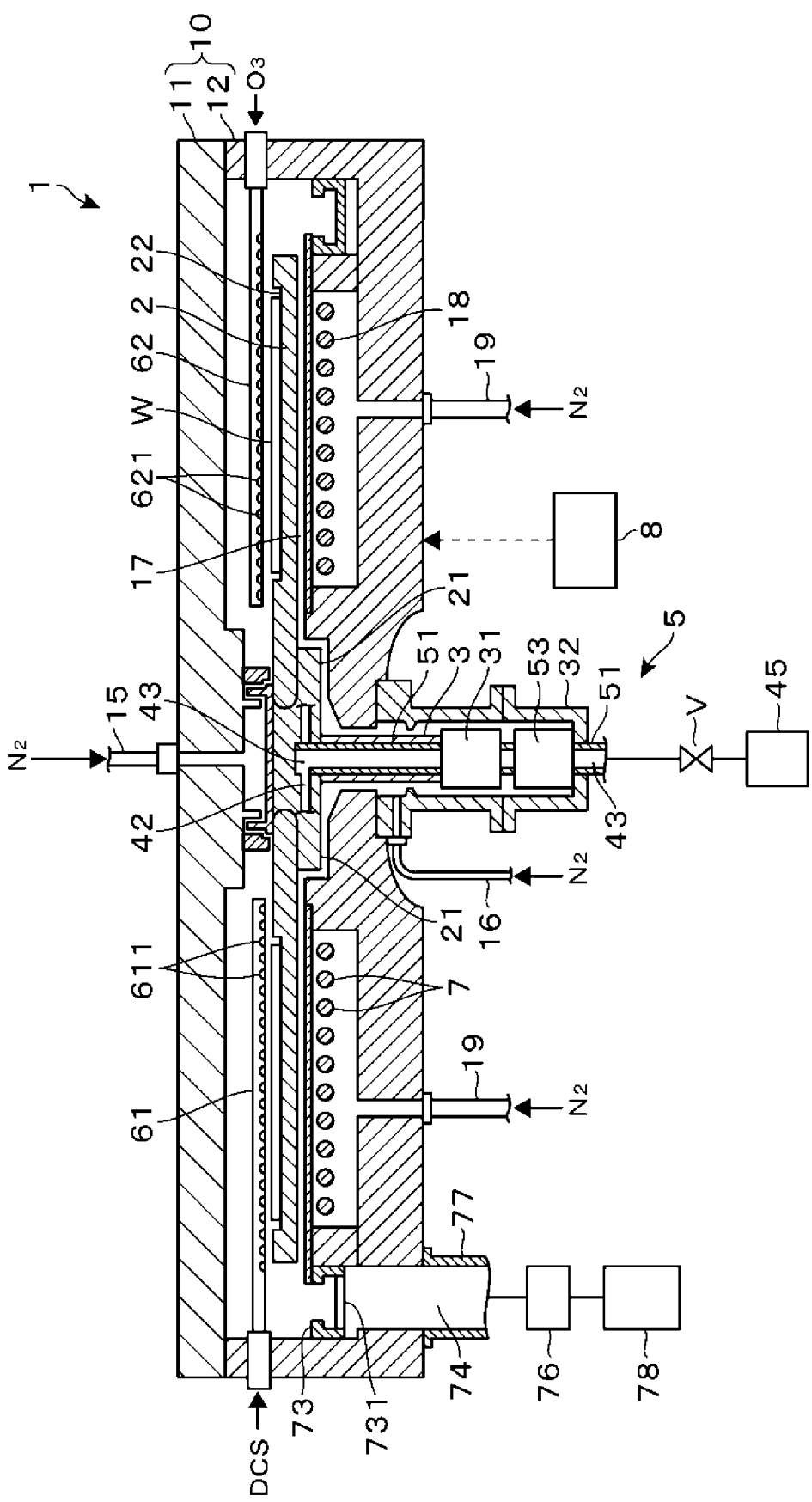
FIG. 1 is a vertical cross-sectional side view illustrating an example of a film forming apparatus of the present disclosure.
Figure 2:
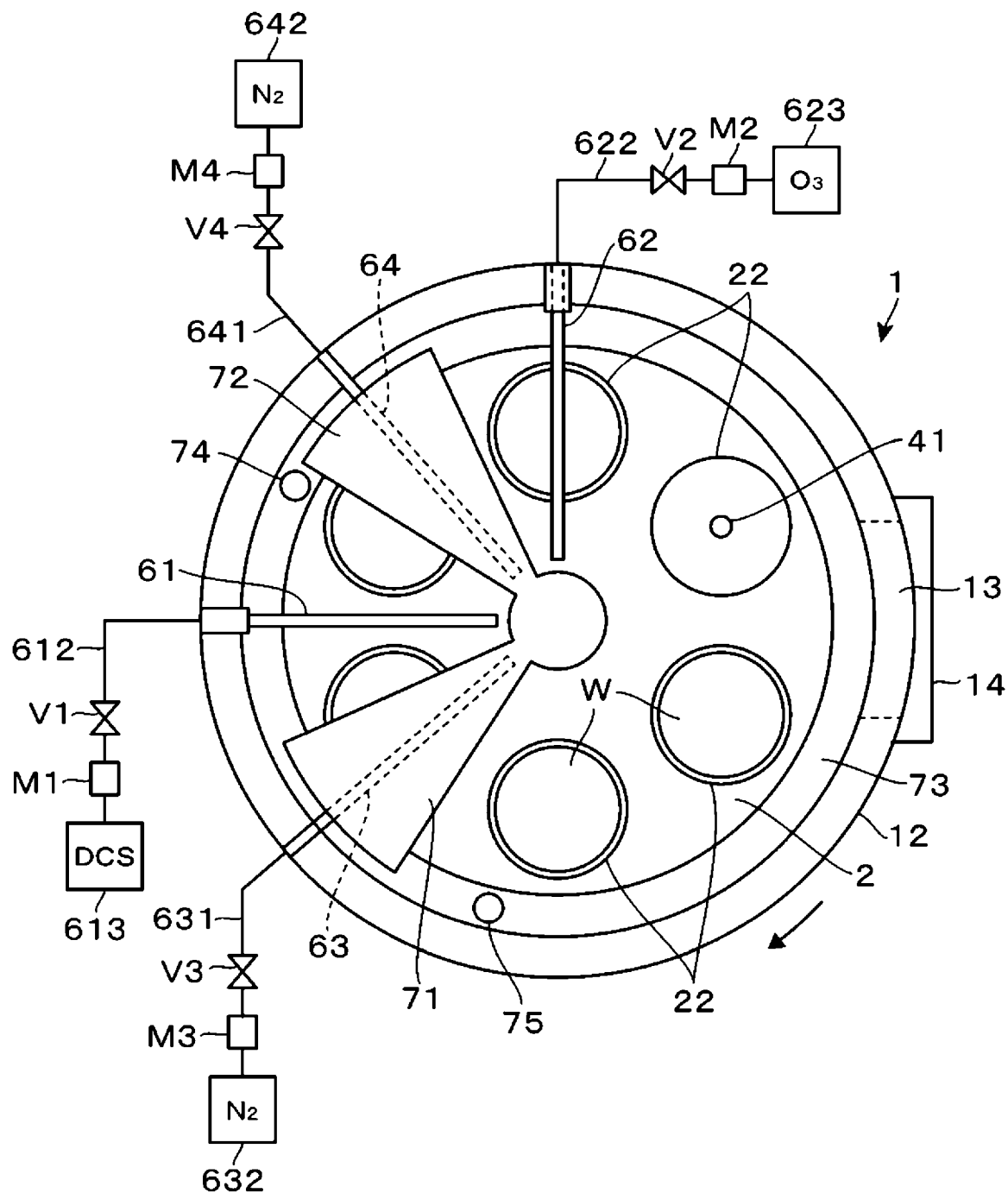
FIG. 2 is a plan view illustrating the example of the film forming apparatus of the present disclosure.

An embodiment of an apparatus for performing a film forming process on a substrate (hereinafter, referred to as a "film forming apparatus") of the present disclosure will be described. As illustrated in FIGS. 1 and 2, a film forming apparatus 1 includes a vacuum container 10 having a circular shape in a plan view. The vacuum container 10 includes a ceiling plate 11 and a container main body 12. The vacuum container 10 is provided therein with a rotary table 2 made of, for example, quartz and configured to revolve a wafer W while having a rotation center at the center of the vacuum container 10.

As illustrated in FIG. 2, the sidewall of the vacuum container 10 is provided with a loading/unloading port 13 through which the wafer W is delivered between an external transfer arm (not illustrated) and the rotary table 2. The loading/unloading port 13 is hermetically closed by an openable/closable gate valve 14. In order to suppress mixing of different processing gases with each other in the internal central portion of the vacuum container 10, a separation gas supply pipe 15 for supplying a nitrogen ($N_2$) gas as a separation gas is connected to the central portion of an upper surface of the ceiling plate 11.

The rotary table 2 is fixed to a core portion 21 in the central portion thereof and is connected to a revolution driving mechanism 31 via a rotary shaft 3 connected to a lower surface of the core portion 21 and extending in the vertical direction. The revolution driving mechanism 31 is configured with, for example, a hollow motor or a hollow shaft motor, and rotates the rotary table 2 around a vertical axis via the rotary shaft 3. The rotary shaft 3 is configured with a tubular body, and a collective exhaust path, which will be described later, is provided inside the rotary shaft 3. In FIG. 1, reference numeral 32 indicates a case body that accommodates the rotary shaft 3 and the revolution driving mechanism 31. A purge gas supply pipe 16 configured to supply a $N_2$ gas as a purge gas to a region below the rotary table 2 is connected to the case body 32.

The rotary table 2 is provided, on one surface side thereof, with recesses 22 that define placement regions on which the wafers W having a diameter of, for example, 300 mm, is placed respectively. As illustrated in FIG. 2, the recesses 22 have a circular shape and are provided at a plurality of locations, for example, six locations, along the rotational direction (circumferential direction) of the rotary table 2. The recesses 22 of this example are provided at equal intervals in the circumferential direction of the rotary table 2. A diameter dimension and a depth dimension of the recesses 22 are set such that, when the wafers W are received in the respective recesses 22, the surfaces of the wafers W and the surface of the rotary table 2 are aligned. In this state, when the rotary table 2 is rotated around the vertical axis by the revolution driving mechanism 31 via the rotary shaft 3, the wafers W placed on the recesses 22 revolve around the rotary shaft 3.

In the rotary table 2, when each recess 22 is moved to a loading/unloading position facing the loading/unloading port 13, the wafer W is delivered to and from the external transfer arm. In a portion corresponding to the loading/unloading position below the rotary table 2, there are provided delivery lifting pins that penetrate the recess 22 to lift up the wafer W from below and a lifting mechanism therefor (neither of which is illustrated).

<Vacuum Chuck Mechanism>

Figure 3:
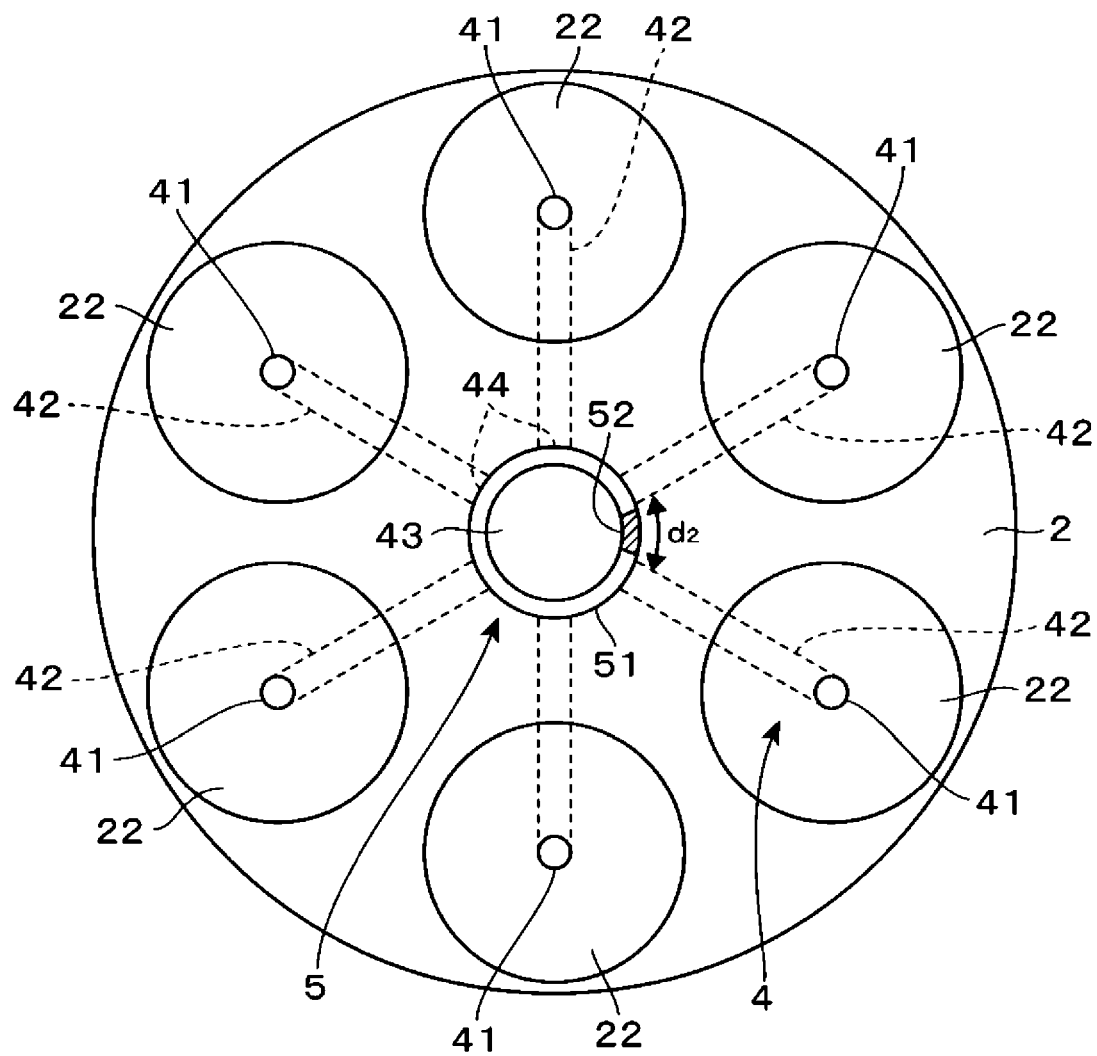
FIG. 3 is a plan view illustrating an example of a rotary table provided in the film forming apparatus.
Figure 4A:
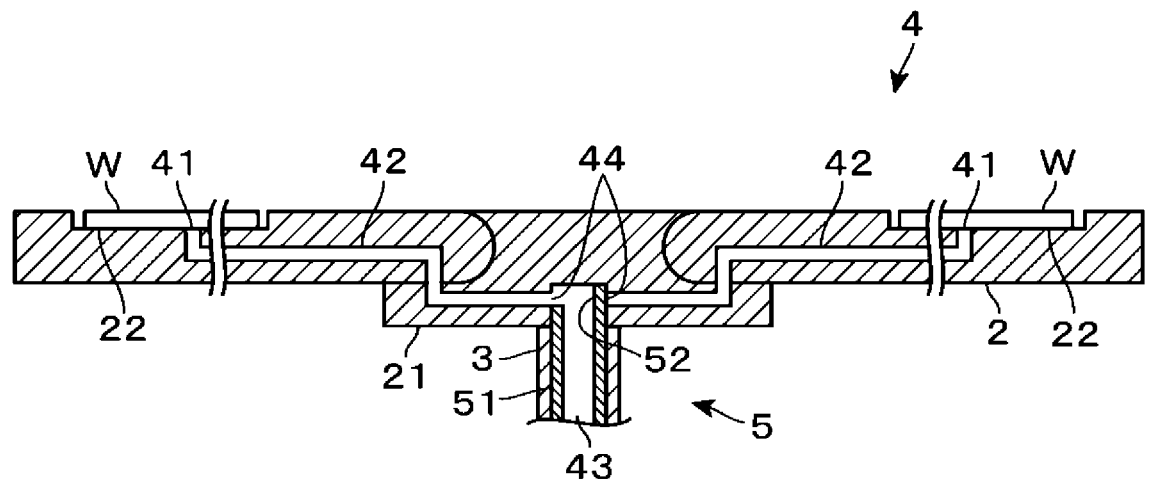
FIG. 4A is a vertical cross-sectional side view illustrating a rotary table provided with a switching mechanism of a first embodiment.

The film forming apparatus 1 is provided with a vacuum chuck mechanism 4 configured to fix the wafer W to each placement region (recess 22) of the rotary table 2 in a suction manner. As illustrated in FIGS. 2, 3, and 4A, the vacuum chuck mechanism 4 includes suction ports 41 opened to respective recesses 22, and six suction flow paths 42 provided to communicate with the respective suction ports 41 and having vacuumable interiors. For example, each suction port 41 is formed to open in the central portion of the bottom surface of each recess 22. For example, each suction flow path 42 is formed to extend substantially horizontally within the rotary table 2, to be bent downward toward the core portion 21 on the center side of the rotary table 2, and then to extend substantially horizontally within the core portion 21 toward the rotary shaft 3. In a plan view, for example, the six suction flow paths 42 are formed to extend radially from a collective exhaust path 43 toward respective suction ports 41.

In this example, a connection portion between the core portion 21 and the rotary shaft 3 and the interior of the rotary shaft 3 are configured as the collective exhaust path 43. The collective exhaust path 43 is provided to extend vertically inside the rotary shaft 3. A base end of the collective exhaust path 43 is connected, via a valve V, to a suction evacuation mechanism 45 that is configured with, for example, a vacuum pump. As illustrated in FIGS. 3 and 4A, for example, end portions of the six suction flow paths 42 are connected to the collective exhaust path 43 inside the core portion 21. In a connection portions between the suction flow paths 42 and the collective exhaust path 43, each of the end portions of the suction flow paths 42 forms an opening 44. For example, sizes and vertical positions of these openings 44 are configured to be aligned with each other in the six suction flow paths 42.

<First Embodiment of Switching Mechanism>

The film forming apparatus 1 includes a switching mechanism 5 configured to switch the operation status of the vacuum chuck mechanism 4. The operation status of the vacuum chuck mechanism 4 is switched between a full fixed state in which all the six wafers W are suctioned and fixed in the recesses 22, respectively, and a selective release state in which the suctioning and fixing of the wafer W is released through a selected suction port that is selected from the six suction ports 41. The selective release state is a state in which only the suctioning and fixing of the wafer W through the selected suction port is released by stopping the evacuation of the suction flow path 42 communicating with the selected suction port. At this time, the suctioning and fixing of the wafers W through the suction ports 41 other than the selected suction port continues.

The switching mechanism 5 includes a switching shaft 51 provided inward of the rotary shaft 3. The switching shaft 51 is configured with a tubular body that is rotatable independently of the rotary shaft 3, and the interior thereof forms the collective exhaust path 43. A switching valve 52 is provided at a portion that connects with the rotary table 2 in the switching shaft 51. The switching valve 52 serves to stop the evacuation of the suction flow paths 42 by closing the openings 44 at the end portions of the suction flow paths 42.

Figure 4B:
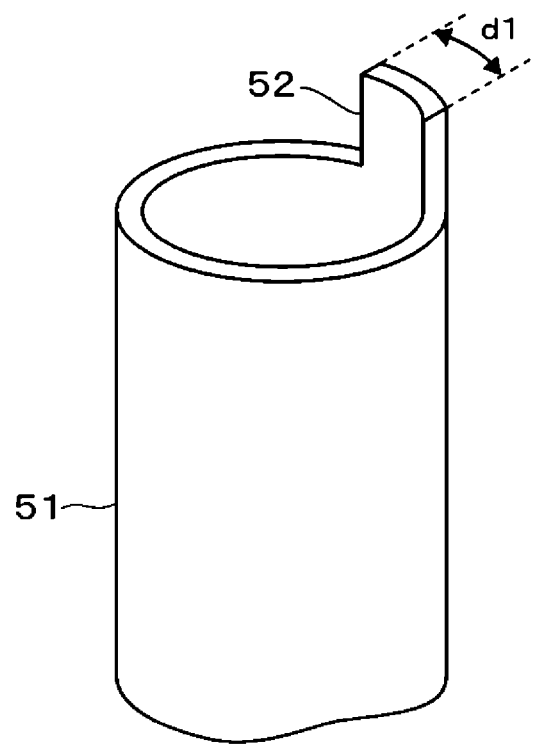
FIG. 4B is a schematic perspective view illustrating a portion of the switching mechanism of the first embodiment.
Figure 5A:
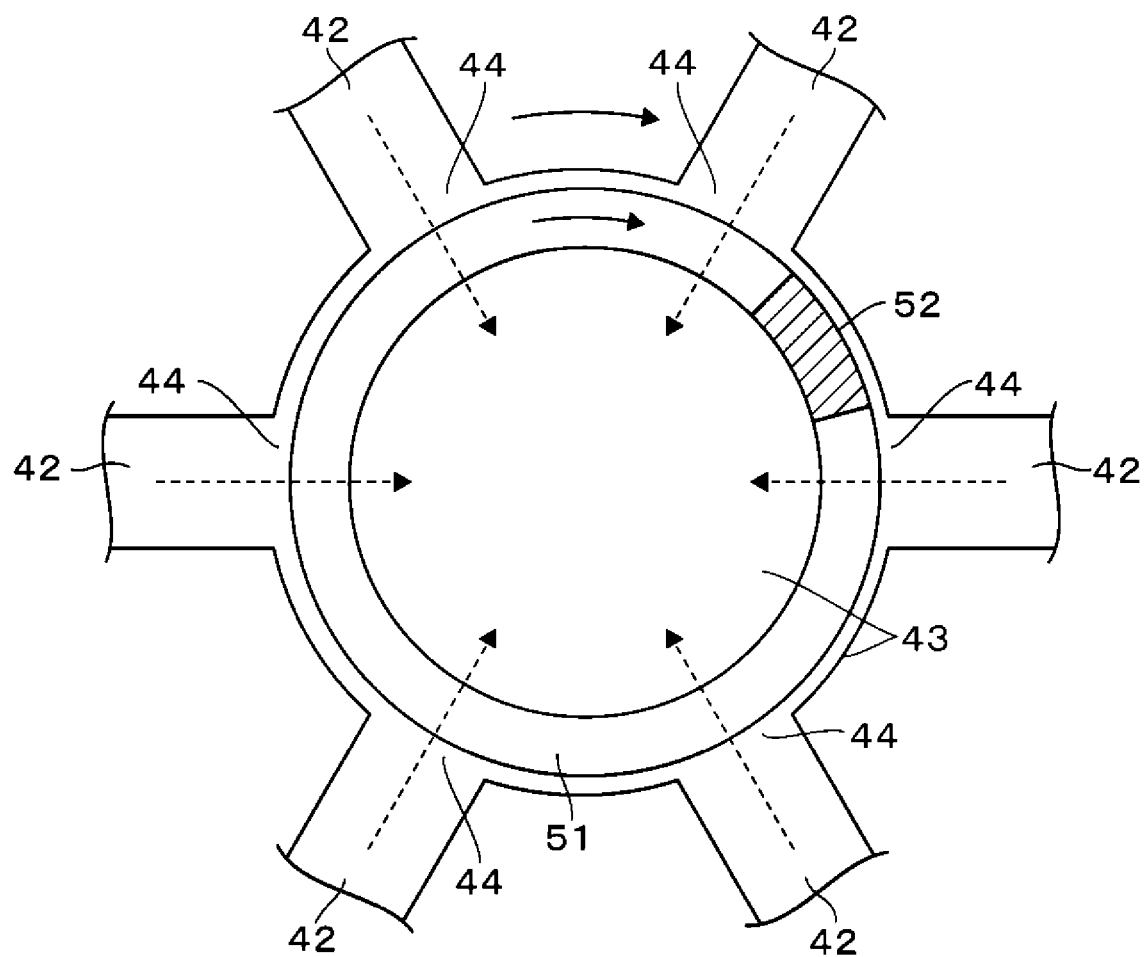
FIG. 5A is a first plan view illustrating an action of the switching mechanism.
Figure 5B:
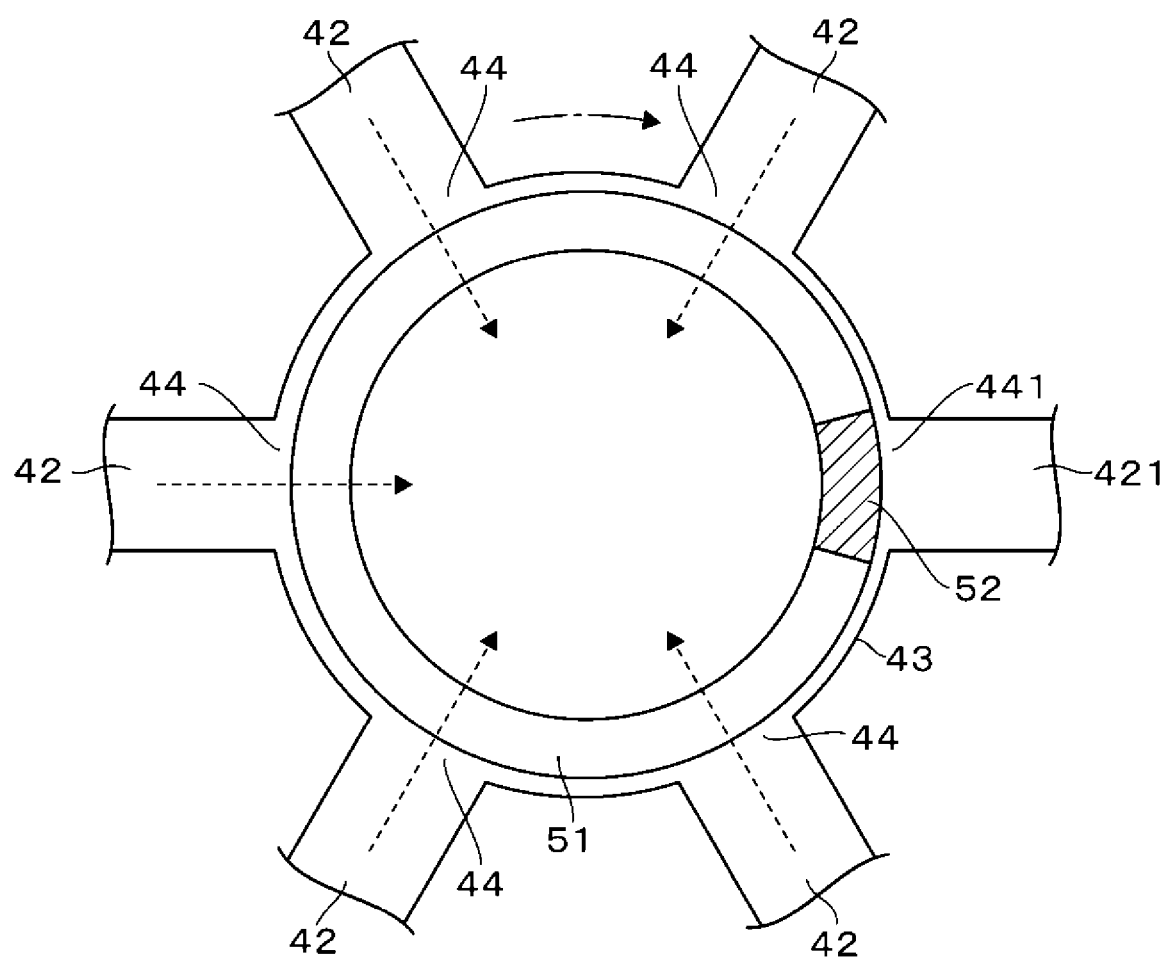
FIG. 5B is a second plan view illustrating an action of the switching mechanism.

As illustrated in FIGS. 3, 4A, and 4B, the switching shaft 51 of this example is configured such that a portion of an upper end thereof protrudes upward to form a protruded surface, and the protruded surface forms the switching valve 52. FIG. 3 illustrates the switching shaft 51 provided inside the core portion 21. In FIGS. 3 and 5A and 5B to be described later, the switching valve 52 is indicated by hatching. The switching shaft 51 is provided within the rotary shaft 3 such that, for example, an upper end edge of the switching shaft 51 in a region in which the switching valve 52 is not provided is located below all the openings 44. The switching valve 52 is capable of covering the opening 44 and is formed in a shape in which a length d1 of the side covering the opening 44 in the rotational direction (see FIG. 4B) is smaller than a length d2 between adjacent openings 44 in the rotational direction (see FIG. 3).

The switching mechanism 5 includes a driving mechanism (switching driving mechanism) 53 configured to rotate the switching shaft 51. In this example, as illustrated in FIG. 1, the lower end of the switching shaft 51 penetrates the hollow revolution driving mechanism 31 and extends downward to be connected to the switching driving mechanism 53. In this configuration, the switching mechanism 5 is configured to rotate the switching shaft 51 relative to the rotary shaft 3, so that the operation status of the vacuum chuck mechanism 4 can be switched between the full fixed state and the selective release state.

That is, when the vacuum chuck mechanism 4 is used in the full fixed state, the switching mechanism 5 retracts the switching valve 52 to a position at which the opening 44 of any suction flow path 42 is not blocked. When the vacuum chuck mechanism 4 is used in the selective release state, the switching valve 52 is disposed at a position at which the opening 44 of the suction flow path 42 communicating with the selected suction port is blocked.

Returning back to FIG. 1, the description of the film forming apparatus 1 will be continued. In the space between the rotary table 2 and the bottom surface of the vacuum container 10, a heater 18 is provided over the entire circumference via a quartz cover member 17. The wafers W are heated by heat radiated from the heater 18 and heat transferred from the rotary table 2 heated by the heater 18. A plurality of purge gas supply pipes 19 penetrating the bottom surface of the vacuum container 10 are provided below the heater 18 at a plurality of locations in the circumferential direction.

As illustrated in FIG. 2, at positions facing regions through which the recesses 22 pass in the rotary table 2, a separation gas supply nozzle 63, a first gas supply nozzle 61 configured to supply a first processing gas, a separation gas supply nozzle 64, and a second gas supply nozzle 62 configured to supply a second processing gas are arranged in this order in the circumferential direction of the vacuum container 10 at intervals in a clockwise direction (the rotational direction of the rotary table 2) when viewed from the loading/unloading port 13.

The first processing gas is a gas to be adsorbed on the wafers W, and the second processing gas is a gas for reacting with the first processing gas to form a thin film on the surface of each of the wafers W. Here, a dichlorosilane ($SiH_2Cl_2$: DCS) gas, which is a raw material gas, is used as the first processing gas, and an ozone ($O_3$) gas, which is an oxidizing gas (a reaction gas), is used as the second processing gas. Hereinafter, a case in which a silicon oxide film ($SiO_2$ film) is formed through the reaction between the DCS gas and the $O_3$ gas) will be described as an example.

Each of the first gas supply nozzle 61 and the second gas supply nozzle 62 extends from an outer peripheral wall of the vacuum container 10 toward the central portion thereof, and is provided to straddle the region through which the wafers W pass when the rotary table 2 is rotated. Each of the first gas supply nozzle 61 and the second gas supply nozzle 62 is formed in a tubular shape with a sealed tip. As shown in FIG. 1, a plurality of gas discharge holes 611 and a plurality of gas discharge holes 621 are formed in lower surfaces of the first gas supply nozzle 61 and the second gas supply nozzle 62, respectively.

As illustrated in FIG. 2, a base end of the first gas supply nozzle 61 is connected to a DCS gas source 613 via a gas supply path 612 provided with a valve V1 and a flow rate adjuster M1. In addition, a base end of the second gas supply nozzle 62 is connected to an $O_3$ gas) source 623 via a gas supply path 622 provided with a valve V2 and a flow rate adjuster M2. A lower side of the first gas supply nozzle 61 forms a first processing region to which the first processing gas is supplied through the discharge holes 611, and a lower side of the second gas supply nozzle 62 forms a second processing region to which the second processing gas is supplied through the discharge holes 621. In addition, for example, the ceiling plate 11 of the second processing region may be provided with an activation mechanism such as an inductively coupled antenna, a microwave antenna, or the like that plasmarizes and activates an $O_3$ gas).

The two separation gas supply nozzles 63 and 64 are similar in configuration to the first gas supply nozzle 61 and the second gas supply nozzle 62, respectively. The base ends of these separation gas supply nozzles 63 and 64 are connected to gas sources 632 and 642 of, for example, a $N_2$ gas, which is a separation gas, via gas supply paths 631 and 641, which are provided with valves V3 and V4 and flow rate adjusters M3 and M4, respectively.

As illustrated in FIG. 2, convex portions 71 and 72 having a substantially fan shape in a plan view are provided above the separation gas supply nozzles 63 and 64, respectively. The $N_2$ gas discharged from the separation gas supply nozzle 63 spreads from the nozzle 63 to opposite sides of the vacuum container 10 in the circumferential direction on the lower side of the convex portion 71, and separates the first processing region and the second processing region from each other at the upstream side of the first gas supply nozzle 61 in the rotational direction of the rotary table 2. In addition, the $N_2$ gas discharged from the separation gas supply nozzle 64 spreads from the nozzle 64 to opposite sides of the vacuum container 10 in the circumferential direction on the lower side of the convex portion 72, and separates the first processing region and the second processing region from each other at the downstream side of the first gas supply nozzle 61 in the rotational direction of the rotary table 2.

As illustrated in FIGS. 1 and 2, a cover body 73 in which a gas flow path 731 is formed is arranged at a position slightly below the rotary table 2 on the outer peripheral side of the rotary table 2. Exhaust ports 74 and 75 are provided on the cover body 73 at two locations, one on the downstream side of the first gas supply nozzle 61 in the rotational direction and the other on the downstream side of the second gas supply nozzle 62 in the rotational direction, to be separated from each other in the circumferential direction. As illustrated in FIG. 1, these exhaust ports 74 and 75 are connected to, for example, a vacuum pump 78, which is an evacuation mechanism, via an exhaust pipe 77 in which a pressure adjuster 76 such as a butterfly valve is provided.

In addition, the film forming apparatus 1 is provided with a controller 8 configured with a computer for controlling the operation of the entire apparatus. A program for executing the film forming process to be described later is stored in a memory of the controller 8. This program incorporates a group of steps for executing the operation of the apparatus, including the operation of the vacuum chuck mechanism 4 and the switching mechanism 5, which will be described later. The program is installed by a storage medium such as a hard disk, a compact disk, a magneto-optical disk, a memory card, a flexible disk, or the like.

<Action of Film Forming Apparatus>

Next, an action of the film forming apparatus 1 described above, including a method of using the vacuum chuck mechanism 4, will be described. First, a step of opening the gate valve 14 and performing transfer of the wafer W between the outside and the rotary table 2 via the loading/unloading port 13 is performed. In the following description, a case of an operation of replacing wafers W in which processed wafers W disposed in respective recesses 22 of the rotary table 2 are unloaded and then wafers W to be processed are loaded will be described. In this step, the evacuation mechanism 45 of the vacuum chuck mechanism 4 is operated to open the valve V, and the evacuation of the collective exhaust path 43 is continuously performed.

Then, along with the rotation of the rotary table 2, the recesses 22 in which delivery is to be performed are sequentially moved to the loading/unloading position facing the loading/unloading port 13. Meanwhile, the operation status of the vacuum chuck mechanism 4 is switched to the selective release state by the switching mechanism 5 such that the suction port 41 provided in the recess 22 for the wafer W loaded through the loading/unloading port 13, that is, the recess 22 moved to the loading/unloading position, becomes the selected suction port.

FIG. 5B illustrates the position of the switching valve 52 in the selective release state. In FIG. 5B, a suction flow path communicating with the selected suction port is denoted by reference numeral 421, and an opening of the end portion of the suction flow path 421 is denoted by reference numeral 441. As illustrated in FIG. 5B, the switching shaft 51 is rotated relative to the rotary shaft 3 by the switching driving mechanism 53, and the switching valve 52 moves to a position for closing the opening 441 (the selective release position) to set the operation status of the vacuum chuck mechanism 4 to the selective release state.

When the switching valve 52 is disposed at the selective release position, the opening 441 of the suction flow path 421 is blocked with respect to the collective exhaust path 43 in which evacuation is performed by the switching valve 52, so that the evacuation of the suction flow path 421 is stopped. As a result, no suction force is generated at the suction port (selected suction port) 41 communicating with the suction flow path 421. By this operation, the suctioning and fixing of the wafer W placed in the recess 22 moved to the loading/unloading position is released.

In this state, the above-mentioned lifting pins (not illustrated) are raised to deliver the wafer W from which the suction and fixing is released to the external transfer arm (not illustrated). Thereafter, a subsequent wafer W to be processed is loaded by the external transfer arm, and is delivered to the recess 22 via the lifting pins.

At this time, in the other recesses 22 that are not located at the loading/unloading position, the suction flow paths 42 are connected to the collective exhaust path 43 via the openings 44. Therefore, as indicated by the broken line arrows in FIG. 5B, the suction flow paths 42 are evacuated toward the evacuation mechanism 45 via the collective exhaust path 43, whereby the suction port 41 of each recess 22 is in the state in which a suction force directed to the suction flow path 42 is generated. Therefore, the suctioning and fixing of the wafers W can be continued in the other recesses 22 that are not in the selective release state.

Subsequently, the rotary table 2 (the rotary shaft 3) is rotated to move, of the recesses 22 in which the wafers W are placed, the recess 22 adjacent on the upstream side in the rotational direction to the loading/unloading position. Accordingly, the recess 22 in which the new wafer W is placed moves from the loading/unloading position by the loading/unloading position described above. During this movement, for example, the switching shaft 51 does not rotate in synchronization with the rotary shaft 3, and the switching valve 52 is stopped at the selective release position. As a result, the opening 44, which has been blocked by the switching valve 52, is relatively moved and opened. By this operation, the suction port 41 of the corresponding recess 22 is connected to the collective exhaust path 43 via the suction flow path 42, and the wafer W is suctioned and fixed to the recess 22 by the evacuation of the vacuum chuck mechanism 4.

Meanwhile, the opening 441 communicating with the suction flow path 42 of the recess 22 in which the next loading and unloading of the wafer W is performed moves to the selective release position at which the switching valve 52 is stopped, whereby the evacuation of the corresponding suction flow path 42 is stopped. As a result, the suctioning and fixing of the wafer W placed in the recess 22 is released.

In this way, the loading/unloading position of the wafer W for each recess 22 is executed by sequentially moving the six recesses 22 to the loading/unloading position while intermittently rotating the rotary table 2.

When the subsequent wafers W to be processed are placed on all the recesses 22, a step of setting the full fixed state in which all the wafers W are suctioned and fixed by sucking and fixing all the wafers W is executed by the vacuum chuck mechanism 4. In this step, as illustrated in FIG. 5A, the switching shaft 51 is rotated relative to the rotary shaft 3 such that the switching valve 52 of the switching mechanism 5 is moved to a position retracted from the openings 44 of all the suction flow paths 42 (a retracted position).

As illustrated in FIG. 5A, the retracted position is a position between adjacent openings 44. When the switching valve 52 is in the retracted position, all the openings 44 are opened to the collective exhaust path 43. As a result, as illustrated by the broken line arrows in FIG. 5A, the six suction flow paths 42 are evacuated through the collective exhaust path 43, whereby a suction force directed to the suction flow path 42 acts in each of the suction ports 41. By this suction force, the wafers W are suctioned and fixed to the six recesses 22, respectively, and thus the vacuum chuck mechanism 4 operates in the full fixed state.

As described above, in this embodiment, by rotating the switching shaft 51 of the switching mechanism 5 relative to the rotary shaft 3 of the rotary table 2, the operation status of the vacuum chuck mechanism 4 is switched between the selective release state and the full fixed state. When the operation of the evacuation mechanism 45 of the vacuum chuck mechanism 4 is stopped in the state in which the wafers W are suctioned and fixed to all the recesses 22, the suctioning and fixing of all the wafers W may be released at once.

The film forming process will be described later. The gate valve 14 is closed, the interior of the vacuum container 10 is vacuumed by the vacuum pump 78 and the pressure adjuster 76, and the wafers W are heated to, for example, 400 degrees C. by the heater 18 while rotating the rotary table 2, for example, clockwise. Subsequently, while rotating the rotary table 2, the DCS gas, which is the first processing gas, is supplied from the first gas supply nozzle 61. In addition, the $O_3$ gas), which is the second processing gas, is supplied from the second gas supply nozzle 62 to execute the film forming process.

The wafers W pass through the first processing region. In the first processing region, the DCS gas is adsorbed on the wafers W while spreading radially on the rotary table 2. Then, the wafers W on which the DCS gas is adsorbed pass through the second processing region with the rotation of the rotary table 2. When the $O_3$ gas) is supplied to the second processing region, the DCS gas adsorbed on the wafer W is oxidized by the $O_3$ gas), so that a thin film of a silicon oxide film ($SiO_2$ film) is formed on the surfaces of the wafers W.

At this time, the $O_3$ gas) may be activated by using the activation mechanism described above, if necessary.

By continuing the rotation of the rotary table 2 in this way, the six wafers W under revolution alternately and repeatedly pass through the first processing region and the second processing region. Then, the adsorption of the DCS gas on the surfaces of the wafers W and the oxidizing of the components of the adsorbed DCS gas are performed many times in this order, so that reaction products are laminated to form the $SiO_2$ film having a set film thickness.

During this film forming process period, as the rotary table 2 rotates, the switching mechanism 5 rotates the switching shaft 51 by the switching driving mechanism 53 such that the operation status of the vacuum chuck mechanism 4 can be maintained in the full fixed state. That is, in order to always dispose the switching valve 52 in the retracted position, the operations of the revolution driving mechanism 31 and the switching driving mechanism 53 are controlled such that the switching shaft 51 rotates in synchronization with the rotary shaft 3. In this way, during the film forming process of the wafers W, the vacuum chuck mechanism 4 is used in the full fixed state.

When the $SiO_2$ film having the set film thickness is formed and the film forming process period is completed, the step of performing loading and unloading of the wafers W through the loading/unloading port 13 is executed. In this step, the operation status of the vacuum chuck mechanism 4 is switched to the selective release state. When the unloading of the wafers W is performed, the recesses 22 in which delivery is performed are sequentially moved to the loading/unloading position facing the loading/unloading port 13 by the rotation of the rotary table 2. Then, as illustrated in FIG. 5B, the operation status of the vacuum chuck mechanism 4 is set by the switching mechanism 5 such that the suction port 41 provided in the recess 22 for the wafer W unloaded through the loading/unloading port 13, that is, the recess 22 moved to the loading/unloading position, becomes the selected suction port.

In this way, as described above, the evacuation of the suction flow path 421 is stopped by closing the opening 441 of the suction flow path communicating with the selected suction port by the switching valve 52, and the suctioning and fixing of the wafer W through the selected suction port is released. Then, as described above, the wafer W is floated from the recess 22 by the above-mentioned delivery mechanism, is delivered to and from the external transfer arm, and is unloaded from the loading/unloading port 13, and the subsequent wafer W to be processed is loaded.

According to the above-described embodiment, the wafers W are placed respectively in the recesses 22 which are a plurality of placement regions provided on one surface of the rotary table 2, and the operation status of the vacuum chuck mechanism 4 for suctioning and fixing the wafers W to the recesses 22 is switched in revolving the wafers W to perform the film forming process. That is, the switching mechanism 5 switches the operation status of the vacuum chuck mechanism 4 between the full fixed state in which all wafers W are suctioned and fixed and the selective release state in which the suctioning and fixing of a selected wafer W is released. Therefore, it is possible to release the suctioning and fixing of the selected wafer W to the recess 22.

In the configuration in which only the wafer W selected in this way can be released from the suctioning and fixing, it is possible to suppress a misalignment of the wafers W in the recesses 22 and an upward movement of particles. That is, in a configuration that does not include the switching mechanism 5 of this example, only the switching between batch execution and batch release of suctioning and fixing is performed in all the recesses 22. Therefore, when wafers W are replaced after the film forming process, the suctioning and fixing of the wafers W to all the recesses 22 is released. Meanwhile, since the rotary table 2 continues to rotate, the wafers W are revolved in the state of being released from the suctioning and fixing, in the recesses 22 in which the wafers W, which are not the targets to be unloaded, are placed. As a result, the wafers W may be moved due to a centrifugal force of rotation, which may cause misalignment. In addition, when the wafers W on which a thin film has been formed in the film forming process are displaced, the thin film deposited in the recesses 22 is peeled off, which may cause the generation of particles.

In addition, since the rotary table 2 rotates before the wafers W newly placed in the recesses 22 are suctioned and fixed, the wafers W may be moved due to the centrifugal force of rotation, causing misalignment and deterioration of uniformity in the subsequent film forming process.

In contrast, in the present disclosure, since the suctioning and fixing of only the selected wafer W can be released by the actions of the switching mechanism 5 and the vacuum chuck mechanism 4, it is possible to suppress the displacement of the wafers W in the recesses 22, the upward movement of particles, and the like.

In the present disclosure, as described above, only the selected wafer W is released from suctioning and fixing to the recess 22, and the wafers W other than the selected wafer W can be suctioned and fixed to the recess 22. Therefore, when the wafer W is delivered between the rotary table 2 and the outside, the suctioning and fixing of the wafers W other than a wafer to be delivered to a recess 22 are maintained whereby the movement of the corresponding wafers W is suppressed. This makes it possible to shorten the time required for the transfer of the wafers W to the film forming apparatus 1 by increasing the rotation speed of the rotary table 2 at the time of loading and unloading of the wafers W.

In addition, the switching mechanism 5 of the present disclosure switches the operation status of the vacuum chuck mechanism 4 between the full fixed state and the selective release state depending on whether to close the end portion of the suction flow path 42 communicating with the suction port 41 on the evacuation mechanism 45 side by the switching valve 52 of the switching shaft 51. In the above-described example, the position of the switching valve 52 is set to each of the position at which the full fixed state is set and the position at which the selective release state is set, by the simple configuration in which the switching shaft 51 is rotated relative to the rotary shaft 3. Thus, it is possible to easily switch the operation status with the simple configuration while suppressing the complexity and size of the apparatus configuration compared to a configuration that requires a multi-system exhaust path, such as a configuration in which a vacuum exhaust mechanism for a vacuum chuck is provided in each of a plurality of placement regions to perform the switching between the full fixed state and the selective release state.

Second Embodiment

Next, a second embodiment of the switching mechanism of the present disclosure will be described with reference to FIGS. 6A and 6B. A switching mechanism 5A is different from that of the first embodiment in that the switching shaft 51 is moved up and down relative to the rotary shaft 3 to switch the operation status of the vacuum chuck mechanism 4. In this embodiment, as illustrated in these drawings, the lower end of the switching shaft 51 penetrates the revolution driving mechanism 31 of the rotary shaft 3 and is connected to the lifting mechanism 54. The switching mechanism 5A is similar in configuration to that of the first embodiment except that the lifting mechanism 54 is used instead of the switching driving mechanism 53. Configurations of the film forming apparatus 1 other than the above are similar to those of the first embodiment.

Figure 6A:
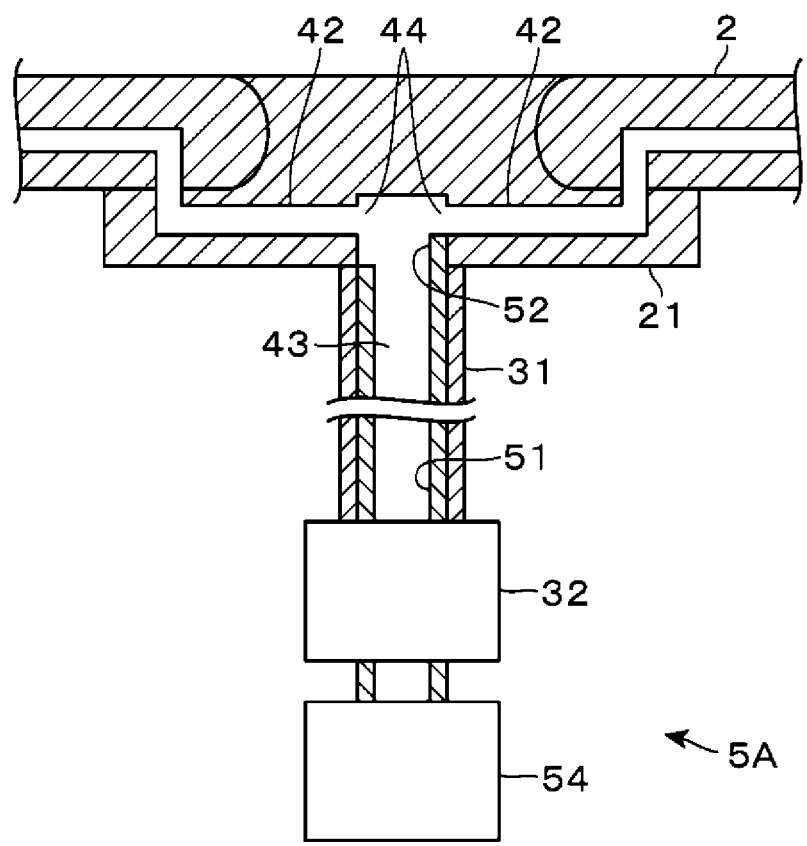
FIG. 6A is a vertical cross-sectional side view illustrating a rotary table provided with a switching mechanism of a second embodiment.

FIG. 6A illustrates an operation status in which the vacuum chuck mechanism 4 is used in the full fixed state. In this state, the switching shaft 51 is set to a height position at which the switching valve 52 does not close the opening 44 of each suction flow path 42. Therefore, the path from the collective exhaust path 43 to the suction port 41 of each recess 22 via each suction flow path 42 is evacuated, and the full fixed state in which wafers W are suctioned and fixed to all the recesses 22 is obtained.

Figure 6B:
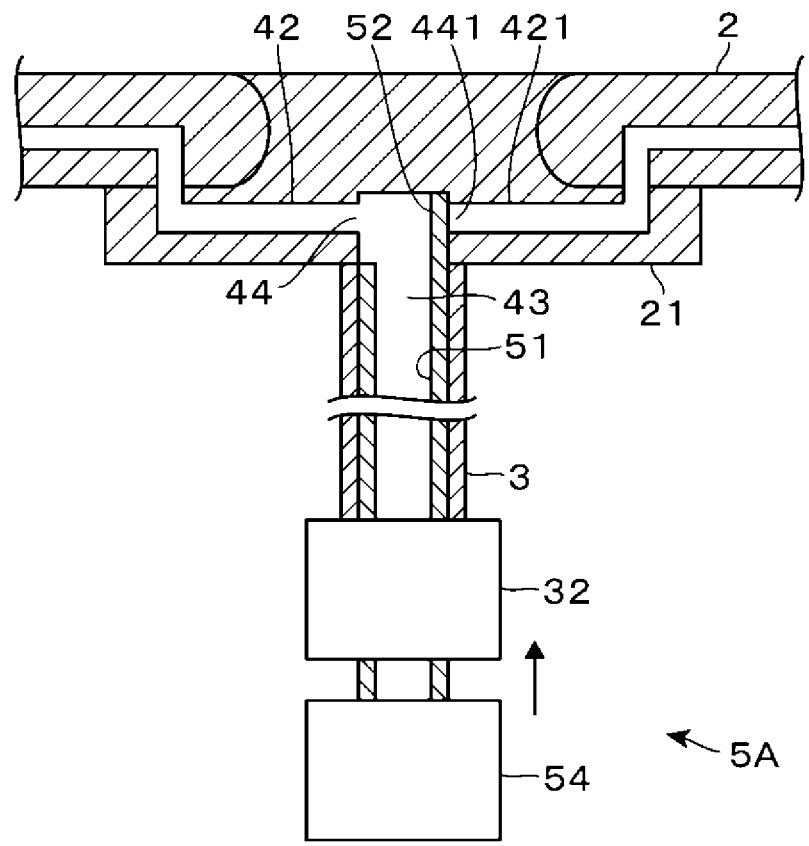
FIG. 6B is a vertical cross-sectional side view illustrating the rotary table provided with the switching mechanism of the second embodiment.

Further, FIG. 6B illustrates an operation status in which the vacuum chuck mechanism 4 is used in the selective release state. In this state, the switching shaft 51 is set to a height at which the switching valve 52 closes the opening 441 of the selected suction flow path 421. Therefore, the selected suction flow path 421 is cut off from the collective exhaust path 43, and the selected suction port communicating with the suction flow path 421 is in the selective release state in which the suctioning and fixing of the wafer W is released. As described above, in this example as well, by moving the switching shaft 51 of the switching mechanism 5 up and down relative to the rotary shaft 3, the operation status of the vacuum chuck mechanism 4 can be switched between the full fixed state and the selective release state. Thus, the same effects as those of the first embodiment can be obtained.

Third Embodiment

Next, a third embodiment of the switching mechanism of the present disclosure will be described with reference to FIG. 7. A switching mechanism 5B is different from those of the first and second embodiments in that a mechanical opening/closing valve 55 is provided at the end portion of the suction flow path 42 of each recess 22. The opening/closing valve 55 is formed in a shape capable of closing, for example, the end portion 40 of the suction flow path 42 so that the end portion 40 of the suction flow path 42 can be opened/closed. Therefore, the opening/closing valve 55 is configured to be raised and lowered, for example, by the lifting mechanism 56, between an upper position at which the opening/closing valve 55 closes the end portion 40 and a lower position at which the opening/closing valve 55 opens the end portion 40. In this example, the end portion 40 is set to a position slightly closer to the suction port 42 than the position at which the suction flow path 42 and the collective exhaust path 43 are connected to each other. Configurations of the film forming apparatus 1 other than the switching mechanism 5B are similar to those of the first embodiment.

In this embodiment, in the operation status in which the vacuum chuck mechanism 4 is used in the full fixed state, all the opening/closing valves 55 of the switching mechanism 5B are set to the lower position. In this way, the end portions 40 of all the suction flow paths 42 are connected to the collective exhaust path 43, and the paths communicating with the suction ports 41 are evacuated through respective suction flow paths 42, so that the full fixed state in which the wafers W are suctioned and fixed in all the recesses 22 is obtained.

Figure 7:
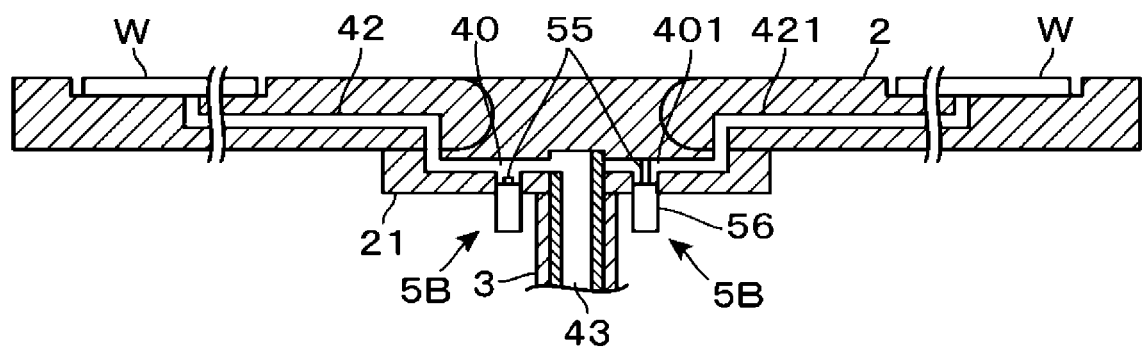
FIG. 7 is a vertical cross-sectional side view illustrating a rotary table provided with a switching mechanism of a third embodiment.

Further, as illustrated in FIG. 7, in the operation status in which the vacuum chuck mechanism 4 is used in the selective release state, in the switching mechanism 5B, the opening/closing valve 55 of the selected suction flow path 421 is set to the upper position and the opening/closing valves 55 of the other suction flow paths 42 are set to the lower positions, respectively. As a result, the end portion 401 of the selected suction flow path 421 is closed by the opening/closing valve 55 to shut off from the collective exhaust path 43, and the selected suction port communicating with the suction flow path 421 is in the selective release state in which the suctioning and fixing of the wafer W is released. In this way, in this example as well, by providing the mechanical opening/closing valve 55 for each suction flow path 42, it is possible to switch the operation status of the vacuum chuck mechanism 4 between the full fixed state and the selective release state, and the effect of using the vacuum chuck mechanism 4 in the selective release state is obtained.

In the above, in the step of performing the loading and unloading of the wafer W into and from the vacuum container 10, the vacuum chuck mechanism 4 may be set to the selective release state at least when the wafer W is unloaded. This is because, when the wafer W is loaded, by sufficiently reducing the rotation speed of the rotary table 2, it may be possible to suppress the occurrence of misalignment of the wafer W without performing the suctioning and fixing by the vacuum chuck mechanism 4. In this case, for example, the evacuation by the vacuum chuck mechanism 4 may be initiated after placing wafers W in all the placement regions (recesses), and the operation status may be set to the full fixed state, so that all the wafers W are suctioned and fixed.

The step of performing the loading and unloading of the wafer W into and from the vacuum container 10 is not limited to the case in which, with respect to a recess 22, a wafer replacement operation in which a processed wafer W is unloaded and then a subsequent wafer to be processed is loaded is performed. For example, after executing the loading step of placing unprocessed wafers W in all the recesses 22, the above-mentioned film forming process may be executed, and then the unloading step of unloading the processed wafers W from all the recesses 22 may be executed.

The film forming apparatus of the present disclosure is not limited to the above-described configuration, and may be configured such that the rotary shaft is connected to the upper surface side of the rotary table and the rotary table is rotated by the rotary shaft in a suspended state. In addition, the placement regions for wafers W provided on the rotary table do not necessarily have to be formed in a concave shape because the wafers W are suctioned and fixed to the placement regions by the vacuum chuck mechanism.

The example illustrated in FIGS. 1 and 2 is an example in which the configuration in which the first and second processing regions are separated by using the substantially fan-shaped convex portions 71 and 72, and the first gas supply nozzle 61 and the second gas supply nozzle 62 extending along the radial direction of the rotary table 2 are disposed in the respective processing regions, is applied to the film forming apparatus 1.

The film forming apparatus is not limited to this example. For example, a first processing region is configured as a fan-shaped space in which a portion of a circular space above the rotary table is partitioned in the circumferential direction, and the remaining space is set as the second processing region. The first processing region is partitioned from the second processing region by an exhaust port surrounding an injection part configured to supply a raw material gas and an injection port surrounding the exhaust port and configured to supply a purge gas. The vacuum chuck mechanism 4 and the switching mechanism 5 of the present disclosure are also applicable to the film forming apparatus having this configuration.

In the film forming apparatus of the present disclosure, the DCS gas has been described to be used as the first processing gas, but is not limited thereto. For example, a gas containing silicon such as a bis(tertiarybutylamino)silane (BTBAS) gas may be used. In addition, the $O_3$ gas) has been described to be used as the second processing gas, but is not limited thereto and other oxidizing gas may be used. Furthermore, the present disclosure may also be applied to a film forming apparatus that forms a silicon nitride (SiN) film on the wafer W by using a silicon-containing gas, such as a DCS gas, as the first processing gas and a nitriding gas, such as an ammonia ($NH_3$) gas, as the second processing gas. In addition, the vacuum chuck mechanism 4 and the switching mechanism 5 according to the present disclosure may be applied to a film forming apparatus that performs film formation of various films by a reaction between a first processing gas and a second processing gas, which are not limited to the above-described examples.

According to the present disclosure, in a case of forming a thin film on each substrate by suctioning and fixing each substrate in each of a plurality of placement regions provided on a rotary table and revolving each substrate, it is possible to release the suctioning and fixing of the substrate in a selected placement region.

The embodiments disclosed herein should be considered to be exemplary in all respects and not restrictive. The above-described embodiments may be omitted, replaced, or modified in various forms without departing from the scope and gist of the appended claims.

What is claimed is:

1. An apparatus that performs a film forming process on a substrate, comprising:
    a rotary table having one surface on which a plurality of substrates are placed and configured to revolve the plurality of substrates around a rotary shaft by rotating around the rotary shaft;
    a vacuum container configured to accommodate the rotary table and configured such that a space formed between the vacuum container and the one surface of the rotary table is separated into a first processing region to which a first processing gas to be adsorbed on the plurality of substrates is supplied and a second processing region to which a second processing gas that reacts with the first processing gas to form a thin film on surfaces of the plurality of substrates is supplied, wherein the plurality of substrates repeatedly and alternately pass through the first processing region and the second processing region;
    a vacuum chuck mechanism provided in the rotary table and including a plurality of suction ports opened to placement regions on which the plurality of substrates are placed, to suction and fix the plurality of substrates, respectively, and a plurality of suction flow paths provided to communicate with the plurality of suction ports, respectively, so that interiors of the plurality of suction flow paths are evacuated; and
    a switching mechanism configured to switch an operation status of the vacuum chuck mechanism between a full fixed state in which the plurality of substrates are suctioned and fixed through the plurality of suction ports and a selective release state in which the evacuation of a suction flow path of the plurality of suction flow paths communicating with a selected suction port that is selected from the plurality of suction ports is stopped, so that the suctioning and fixing of the substrate through the selected suction port is released.

2. The apparatus of claim 1, wherein the vacuum container is provided with a loading/unloading port through which each of the plurality of substrates is transferred between an outside and the rotary table, and
    the switching mechanism is configured to switch the operation status such that, in the selective release state, the suction port provided in the placement region of the substrate transferred through the loading/unloading port becomes the selected suction port.

3. The apparatus of claim 2, wherein the rotary table is configured to sequentially move the placement regions in which delivery of the plurality of substrates is performed to a loading/unloading position facing the loading/unloading port, and
    the switching mechanism is configured to switch the operation status such that, in the selective release state, the suction port of the placement region moved to the loading/unloading position becomes the selected suction port.

4. The apparatus of claim 3, wherein the switching mechanism is configured to switch the operation status of the vacuum chuck mechanism to the full fixed state during the film forming process of the plurality of substrates.

5. The apparatus of claim 4, wherein the rotary shaft is configured with a tubular body, and includes a collective exhaust path formed to be connected to each of end portions of the plurality of suction flow paths and configured to perform the evacuation of the plurality of suction flow paths.

6. The apparatus of claim 5, wherein the rotary shaft is provided therein with a switching shaft configured with a tubular body that forms the collective exhaust path and is rotatable independently of the rotary shaft, wherein the switching shaft includes, on a portion to be connected with the rotary table, a switching valve that is configured to close an opening of the end portion of a corresponding suction flow path of the plurality of suction flow paths to stop the evacuation of the corresponding suction flow path, and
    the switching mechanism is configured to perform the switching of the operation status by rotating the switching shaft relative to the rotary shaft such that, in the selective release state, the switching valve moves to a position that closes the opening of the corresponding suction flow path communicating with the selected suction port.

7. The apparatus of claim 6, wherein the switching mechanism is configured to perform the switching of the operation status by rotating the switching shaft relative to the rotary shaft such that, in the full fixed state, the switching valve moves to a position retracted from the openings of the end portions of all the plurality of suction flow paths communicating with the plurality of suction ports.

8. The apparatus of claim 7, wherein, when the rotary shaft is rotated in the full fixed state, the switching shaft rotates in synchronization with the rotary shaft.

9. The apparatus of claim 1, wherein the switching mechanism is configured to switch the operation status of the vacuum chuck mechanism to the full fixed state during the film forming process of the plurality of substrates.

10. The apparatus of claim 1, wherein the rotary shaft is configured with a tubular body, and includes a collective exhaust path formed to be connected to each of end portions of the plurality of suction flow paths and configured to perform the evacuation of the plurality of suction flow paths.

11. A method of using a vacuum chuck mechanism provided in an apparatus for performing a film forming process on a plurality of substrates,
wherein the apparatus includes:
a rotary table having one surface on which the plurality of substrates are placed and configured to revolve the plurality of substrates around a rotary shaft by rotating around the rotary shaft;
a vacuum container configured to accommodate the rotary table and configured such that a space formed between the vacuum container and the one surface of the rotary table is separated into a first processing region to which a first processing gas to be adsorbed on the plurality of substrates is supplied and a second processing region to which a second processing gas that reacts with the first processing gas to form a thin film on surfaces of the plurality of substrates is supplied, wherein the plurality of substrates repeatedly and alternately pass through the first processing region and the second processing region; and
a vacuum chuck mechanism provided in the rotary table and including a plurality of suction ports opened to placement regions on which the plurality of substrates are placed, to suction and fix the plurality of substrates, respectively, and a plurality of suction flow paths provided to communicate with the plurality of suction ports, respectively, so that interiors of the plurality of suction flow paths are evacuated,
the method comprising:
performing a switching between setting a full fixed state in which the plurality of substrates are suctioned and fixed through the plurality of suction ports and setting a selective release state in which the evacuation of a suction flow path of the plurality of suction flow paths communicating with a selected suction port that is selected from the plurality of suction ports is stopped, so that the suctioning and fixing of the substrate through the selected suction port is released.

12. The method of claim 11, further comprising:
performing loading/unloading of each of the plurality of substrates between an outside and the rotary table through a loading/unloading port provided in the vacuum container,
wherein, in setting the selective release state, the vacuum chuck mechanism is used such that, in the performing the loading/unloading of the substrate, the suction port provided in the placement region for the substrate transferred through the loading/unloading port becomes the selected suction port.

13. The method of claim 12, further comprising:
sequentially moving, by the rotary table, the plurality of placement regions in which a delivery of the plurality of substrates is performed to a loading/unloading position facing the loading/unloading port,
wherein in the setting the selective release state, the vacuum chuck mechanism is used such that the suction port of the placement region moved to the loading/unloading position in the sequentially moving the plurality of placement regions becomes the selected suction port.

14. The method of claim 13, wherein the vacuum chuck mechanism is used such that the setting the full fixed state is executed during the film processing process of the plurality of substrates.

15. The method of claim 11, wherein the vacuum chuck mechanism is used such that the setting the full fixed state is executed during the film processing process of the plurality of substrates.

* * * * *